United States Patent
Sluiter et al.

(10) Patent No.: US 7,065,683 B1
(45) Date of Patent: Jun. 20, 2006

(54) LONG PATH AT-SPEED TESTING

(75) Inventors: David O. Sluiter, Superior, CO (US); Robert W. Moss, Longmont, CO (US); Mark J. Kwong, Santa Clara, CA (US); Peter Korger, Frederick, CO (US); Christopher M. Giles, Lafayette, CO (US)

(73) Assignee: LSI Logic Corporation, Milpitas, CA (US)

( * ) Notice: Subject to any disclaimer, the term of this patent is extended or adjusted under 35 U.S.C. 154(b) by 522 days.

(21) Appl. No.: 10/011,796

(22) Filed: Dec. 5, 2001

(51) Int. Cl.
  G11B 20/20 (2006.01)
  G06F 11/00 (2006.01)

(52) U.S. Cl. ..................... 714/700; 714/744
(58) Field of Classification Search .............. 714/744, 714/724, 726, 741, 742, 30, 45, 700; 716/6; 324/765
See application file for complete search history.

(56) References Cited

U.S. PATENT DOCUMENTS

| | | | |
|---|---|---|---|
| 4,893,072 A * | 1/1990 | Matsumoto ................ 714/731 |
| 5,583,787 A | 12/1996 | Underwood et al. ........ 364/489 |
| 5,757,814 A | 5/1998 | McIntyre | |
| 5,774,476 A | 6/1998 | Pressly et al. | |
| 5,815,655 A * | 9/1998 | Koshiyama ................ 714/45 |
| 5,923,676 A | 7/1999 | Sunter et al. | |
| 6,052,806 A | 4/2000 | Beat .......................... 714/718 |
| 6,075,418 A | 6/2000 | Kingsley et al. .............. 331/57 |
| 6,148,425 A | 11/2000 | Bhawmik et al. ........... 714/726 |
| 6,415,402 B1 * | 7/2002 | Bishop et al. .............. 714/724 |

\* cited by examiner

*Primary Examiner*—Albert Decady
*Assistant Examiner*—James C. Kerveros
(74) *Attorney, Agent, or Firm*—Christopher P. Maiorana PC

(57) ABSTRACT

An apparatus including a plurality of first base circuits, a plurality of second base circuits, a first test circuit, a second test circuit, and a test path. The plurality of first base circuits may be coupled to the plurality of second base circuits via one or more base circuit paths on a layout. The first test circuit may be disposed in a first distal location of the layout. The second test circuit may be disposed in a second distal location of the layout. The test path may be configured to (i) couple the first test circuit to the second test circuit and (ii) generate a test time delay from the first test circuit to the second test circuit incrementally longer than a maximum time delay generated by any of the base circuit paths.

20 Claims, 4 Drawing Sheets

LONG PATH AT-SPEED TESTING

FIELD OF THE INVENTION

The present invention relates to a method and/or architecture for at-speed testing generally and, more particularly, to a method and/or architecture for long path at-speed testing of integrated circuit chips on a tester.

BACKGROUND OF THE INVENTION

In order to perform at-speed testing of integrated circuit chips, the longest timing path through the chip must be identified. Electronic Design Automation (EDA) tools are implemented to identify long timing paths within a given design. EDA tools that attempt to identify long timing paths are referred to as Static Timing Analysis (STA) tools. However, the actual longest path in a given design is often difficult to identify due to false paths that the STA tool reports as the longest. A path that is falsely identified as the longest path is typically a path that cannot be exercised functionally on the tester. Once a functionally exercisable long path has been identified, stimulus patterns can be generated. Stimulus patterns are generated manually or with EDA tools. Stimulus patterns are run on a tester to verify that a piece of silicon (i.e., a given chip design and fabrication) is capable of operating at the desired target frequency. There can be millions of false paths hiding the true functionally exercisable longest path. As a result, the process of identifying functionally exercisable long paths and eliminating false paths can be a time, labor, and cost intensive task.

It would be desirable to have a method and/or architecture for at-speed testing integrated circuit chips that (i) reduces chip development cost and time and (ii) identifies functionally defective chips, and/or (iii) does not mis-identify functionally acceptable chips.

SUMMARY OF THE INVENTION

The present invention concerns an apparatus comprising a plurality of first base circuits, a plurality of second base circuits, a first test circuit, a second test circuit, and a test path. The plurality of first base circuits may be coupled to the plurality of second base circuits via one or more base circuit paths on a layout. The first test circuit may be disposed in a first distal location of the layout. The second test circuit may be disposed in a second distal location of the layout. The test path may be configured to (i) couple the first test circuit to the second test circuit and (ii) generate a test time delay from the first test circuit to the second test circuit incrementally longer than a maximum time delay generated by any of the base circuit paths.

The objects, features and advantages of the present invention include providing a method and/or architecture for at-speed testing of integrated circuit chips on a tester that may (i) implement a long test path that is fully controllable, observable, and/or predictable, (ii) have a test delay propagation that is incrementally longer than the longest false path delay (or the longest functional path delay when the functional path is difficult to control and/or observe), (iii) simplify identification of a long path for at-speed testing, (iv) reduce chip development cost and time, (v) identify functionally defective chips, and/or (vi) reduce mis-identification of functionally acceptable chips.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
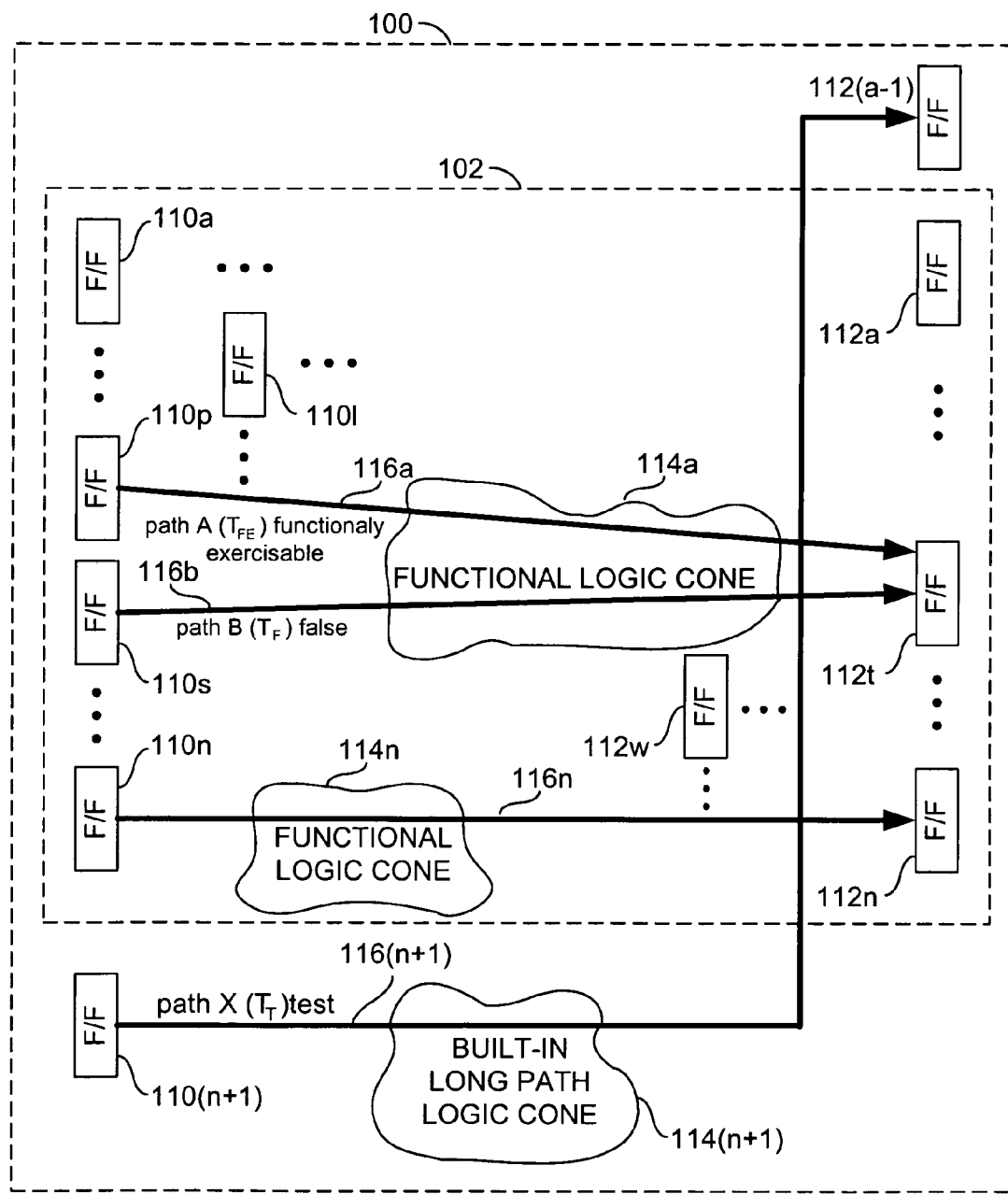
FIG. 1 is a block diagram of a preferred embodiment of the present invention.

Referring to FIG. 1, a block diagram illustrating a circuit 100 in accordance with a preferred embodiment of the present invention is shown. The circuit 100 may be implemented as a long path at-speed testing circuit. The circuit 100 may be implemented as an integrated circuit on a semiconductor die (or wafer). The circuit 100 may be exercised by a tester (not shown).

The circuit 100 generally comprises a base circuit layout 102 and a test circuit. The base circuit layout 102 may comprise a number of base circuits (or devices) 110a–110n, a number of base circuits (or devices) 112a–112n, a number of base circuits (or logic cones) 114a–114n, and a number of base circuit paths 116a–116n. The circuit 100 generally comprises a plurality of the circuits 110, 112, and 114. The circuits 110, 112, and 114 are generally clocked by a common clock. The circuits 110 and 112 are generally implemented as flip-flops (F/Fs). However, any appropriate circuit or device may be implemented accordingly to meet the design criteria of a particular application. The circuits 110a–110n and 112a–112n are generally positioned throughout the layout 102 of the circuit 100. For example, the circuit 110l and the circuit 112w (as well as other circuits 110 and 112, not shown) may be located internal to (e.g., not at the peripheries of) the layout 102. The logic cones 114a–114n may be implemented as logic and/or circuitry internal to the circuit 100 base circuit layout 102. The paths 116a–116n each generally comprise a route through the circuit 100 via the logic cones 114a–114n that may couple one of the devices 110a–110n to one of the devices 112a–112n (e.g., the devices 110 and 112 generally form source-destination flip-flop pairs). The logic cones 114a–114n and the paths 116a–116n may be located between the circuits 110a–110n and 112a–112n on the base circuit 102 layout.

The circuit 100 generally has a large number (sometimes millions) of possible paths 116a–116n between each of the circuits 110a–110n and 112a–112n. Similarly, a large number (sometimes millions) of circuit 110/112 source-destination pairs may be formed. The circuits 110a–110n and 112a–112n and the logic cones 114a–114n may be configured as normal function logic circuits of the circuit 100. The paths 116a–116n may be implemented as the normal logic (e.g., base circuit) paths for the circuit 100.

The test circuit of the circuit 100 layout may be configured as a long test path 116(n+1) that may comprise a test circuit (or device) 110(n+1) coupled to a test circuit (or device) 112(a−1) via a test logic cone 114(n+1). The circuits 110(n+1) and 112(a−1) and the logic cone 114(n+1) may be clocked by a common clock with the circuits 110a–110n, 112a–112n, and 114a–114n. The circuits 110(n+1) and 112

(*a*−1) and the logic cone 114(*n*+1) may be configured as test logic for the circuit 100. The test logic cone 114(*n*+1) may comprise, in part or entirely, logic within the logic cones 114*a*–114*n* (e.g., the long test path logic cone 114(*n*+1) may be built-in). The long path 116(*n*+1) may be implemented as a test path on the circuit 100 layout.

The circuit 110(*n*+1) may be positioned at a distal location relative to the base layout circuit 102. In one example, the circuit 110(*n*+1) may be located below the circuit 102. Similarly, the circuit 112(*a*−1) may be positioned at a second distal location relative to the base layout circuit 102. In one example, the circuit 112(*a*−1) may be located above the circuit 102. However, the distal locations where the circuits 110(*n*+1) and 112(*a*−1) are disposed may be any appropriate location accordingly to meet the design criteria of a particular application.

In another example, the implementation of one or the other of the circuits 110(*n*+1) or 112(*a*−1) may be optional (e.g., the circuit 110*n* may be implemented as the circuit 110(*n*+1) or the circuit 112*a* may be implemented as the circuit 112(*a*−1)). However, the circuit 100 will generally be implemented disposing the circuits 110(*n*+1) and 112(*a*−1) outside of the base circuit 102 layout to ensure that a test operation of the circuit 100 is fully controllable and observable.

The logic cone 114(*n*+1) and the long path 116(*n*+1) may follow a periphery of the base circuit 102 layout. In one example, the path 116(*n*+1) may substantially follow a bottom periphery and a right edge periphery of the base circuit 102 layout. The logic cone 114(*n*+1) (e.g., the long path 116(*n*+1)) may comprise logic and/or circuitry intentionally added to the circuit 100 external to the base circuit 102 to provide a long path for at-speed testing. In another example, the long path logic cone 114(*n*+1) may be configured as built-in logic within the base circuit logic cones 114*a*–114*n* (described in connection with FIG. 2). In yet another example, the long path logic cone 114(*n*+1) may be configured, in part, from logic and/or circuitry intentionally added to the circuit 100 external to the base circuit 102 and, in part, from built-in logic within the base circuit logic cones 114*a*–114*n*.

In one example, the circuits (or devices) 110*a*–110(*n*+1) and 112(*a*−1)–112*n* may be implemented as chip IO devices (e.g., coupled to chip IO pins (not shown)). In another example, the circuits (or devices) 110*a*–110(*n*+1) and 112(*a*−1)–112*n* may be coupled directly and/or indirectly to other on-chip circuits (e.g., an on-chip microprocessor (not shown)). However, the test circuit devices 110(*n*+1) and 112(*a*−1) are generally fully (e.g., 100%) controllable and observable during the at-speed testing process.

The path 116*a* (e.g., a path A) may be configured as a functionally exercisable long path. The path 116*a* may generate a propagation delay (e.g., TFE). The path 116*b* (e.g., a path B) may be configured as a false long path. The path 116*b* may generate a propagation delay (e.g., TF). One of the paths 116*a*–116*n* may generate a maximum false propagation delay (e.g., $TF_{MAX}$). The false long path 116*b* may interfere in the identification of the functionally exercisable long paths in the circuit 100 (e.g., the path 116*a*). Difficulty in identifying of the longest functionally exercisable long path (e.g., the functionally exercisable long path generating the longest delay TFE, $TFE_{MAX}$) may occur when the delay TF is greater than the delay TFE. The circuit 100 may contain many of the paths 116*a*–116*n* where the delay TF is greater than the delay TFE.

The circuits 110(*n*+1) and 112(*a*−1) may be added to the circuit 100 peripheral to the base circuit 102 to control and capture a long path delay (e.g., TT) intentionally built into the design. The test long path 116(*n*+1) may be configured as logic that has been manually (or automatically via appropriate software routines) added to the design to generate a maximum timing path (e.g., a path X) with the propagation delay time TT. The delay TT may be slightly (e.g., incrementally) longer than the delay in any of the paths 116*a*–116*n*. The delay TT may be longer than any delay TF or TFE. The delay TT may be incrementally longer than the maximum delays $TF_{MAX}$ and $TFE_{MAX}$. The delay TT may equal TF+TD, where TD is an incremental delta delay added to the delay TF. The interval TD is generally selected such that the path 116(*n*+1) (e.g., the path X) may be easily identified when compared with the paths 116*a* (e.g., the path A) generating the delay $TFE_{MAX}$ and the path 116*b* (e.g., the path B) generating the delay $TF_{MAX}$ during Static Timing Analysis (STA).

The value (e.g., amount) of the delay TD is generally determined by the logic and/or circuitry that comprises the logic cone 114(*n*+1) when the path 116(*n*+1) is configured. The amount of delay TD in the interval TT may be configured to meet the design criteria of a particular application (e.g., target operating frequency, temperature, etc.). In one example, the maximum false path delay (e.g., $TF_{MAX}$) may be longer than the maximum functionally exercisable delay (e.g., $TFE_{MAX}$). The value of the interval TD may be substantially equal to a parameter z times the maximum false path delay $TF_{MAX}$ (e.g., TD=z*$TF_{MAX}$), where z is a value determined by the user to meet the design criteria of the particular application. In one example, the parameter z may have a nominal value equal to 0.05 (e.g., TD=0.05*$TF_{MAX}$). However, the parameter z may be in a range of 0.001 to 0.5, preferably in a range of 0.02 to 0.08, and more preferably in a range of 0.035 to 0.065. The particular value of z may need to be adjusted as clock frequencies increase.

When the value of z is too large for a particular application, functionally acceptable parts may be improperly misidentified as non-functional. When the value of z is too small, wafer to wafer process variations (e.g., process corners, etch variations, etc.) and/or testing variations (e.g., test temperature, supply voltage, supply ground, etc. variations) may generate variations in the interval TF that exceed the value of TD. The value and/or range of z is generally determined accordingly to meet the design criteria of a particular application. The long test path 116(*n*+1) (e.g., the path X) is generally configured such that the corresponding value of z meets the design requirements of the particular application.

In another example, the false paths 116 (e.g., the paths 116*a*–116*n* corresponding to a false path delay TF) may not complicate the identification of the long path corresponding to the delay TT (e.g., the long path 116(*n*+1)). However, the paths 116*a*–116*n* corresponding to the functionally exercisable delay TFE may be functionally difficult to control. In another example, the circuit 100 may not contain any false paths such as the path 108*b*. When the paths 116*a*–116*n* corresponding to the functionally exercisable delay TFE are difficult to control and/or false paths (and the corresponding delay $TF_{MAX}$) are not present, the interval TD may be substantially equal to z times the maximum functionally exercisable path delay (e.g., TD=z*$TFE_{MAX}$). The nominal value and the range of z when TD equals z*$TFE_{MAX}$ may be determined similarly to the z value when TD equals z times the maximum false path delay (e.g., when TD=z*$TF_{MAX}$).

The present invention may provide a method and/or architecture that may (i) simplify the identification of a long path for at-speed testing and (ii) reduce chip development cost and time. One or more long path logic cones 114(n+1) and long test paths 116(n+1) may be determined to meet the value of the parameter z corresponding to a particular application. The process of locating the distal test circuits 110(n+1) and 112(a−1) and the long test path 116(n+1) may be implemented via "splat" (e.g., substantially random routing) techniques. However, random routing may not yield predictable routing for the long path 116(n+1). The present invention may provide a method and/or architecture to systematically and controllably determine a test long path that may yield predictable routing for the long path 116(n+1).

Figure 2:
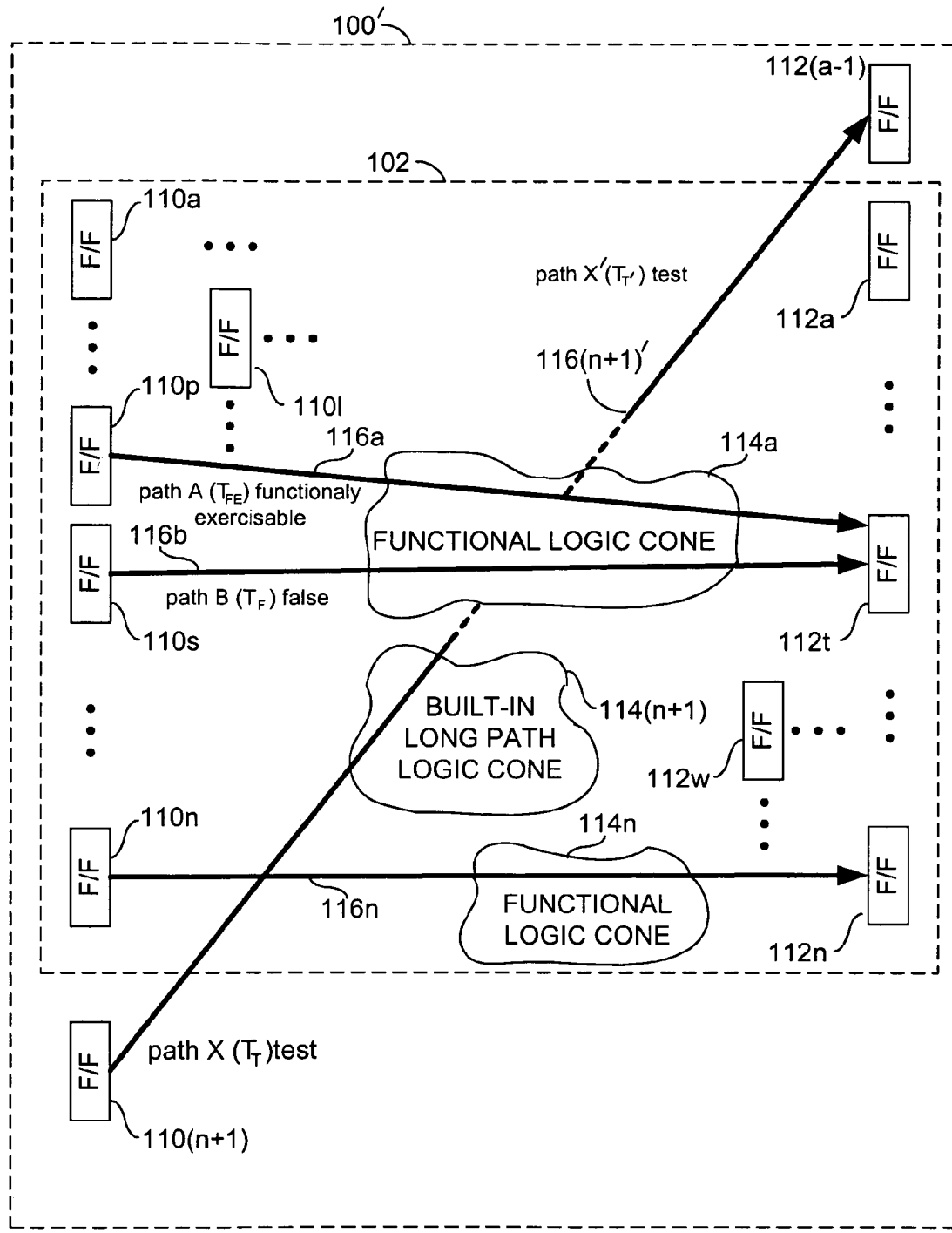
FIG. 2 is a block diagram of an alternative embodiment of the present invention.

Referring to FIG. 2, a block diagram of a circuit 100' illustrating an alternative embodiment of the present invention is shown. The circuit 100' may be implemented similarly to the circuit 100. The circuit 100' generally comprises a built-in long path logic cone 114(n+1)' and a test path 116(n+1)' (e.g., a test path X'). The test path 116(n+1)' may generate a test time delay (e.g., TT'). The built-in long path logic cone 114(n+1)' may be configured along a path substantially directly (e.g., diagonally) from the circuit 110(n+1) to the circuit 112(a−1). The long path 116(n+1)' (and the corresponding delay TT') may reduce or eliminate non-correlation issues of the delay TT when compared to the delay TFE that may occur due to thermal variation across the die where the circuit 100 is implemented. The long test path 116(n+1)' (e.g., the path X') is generally configured such that the corresponding value of z meets the design requirements of the particular application.

Figure 3:
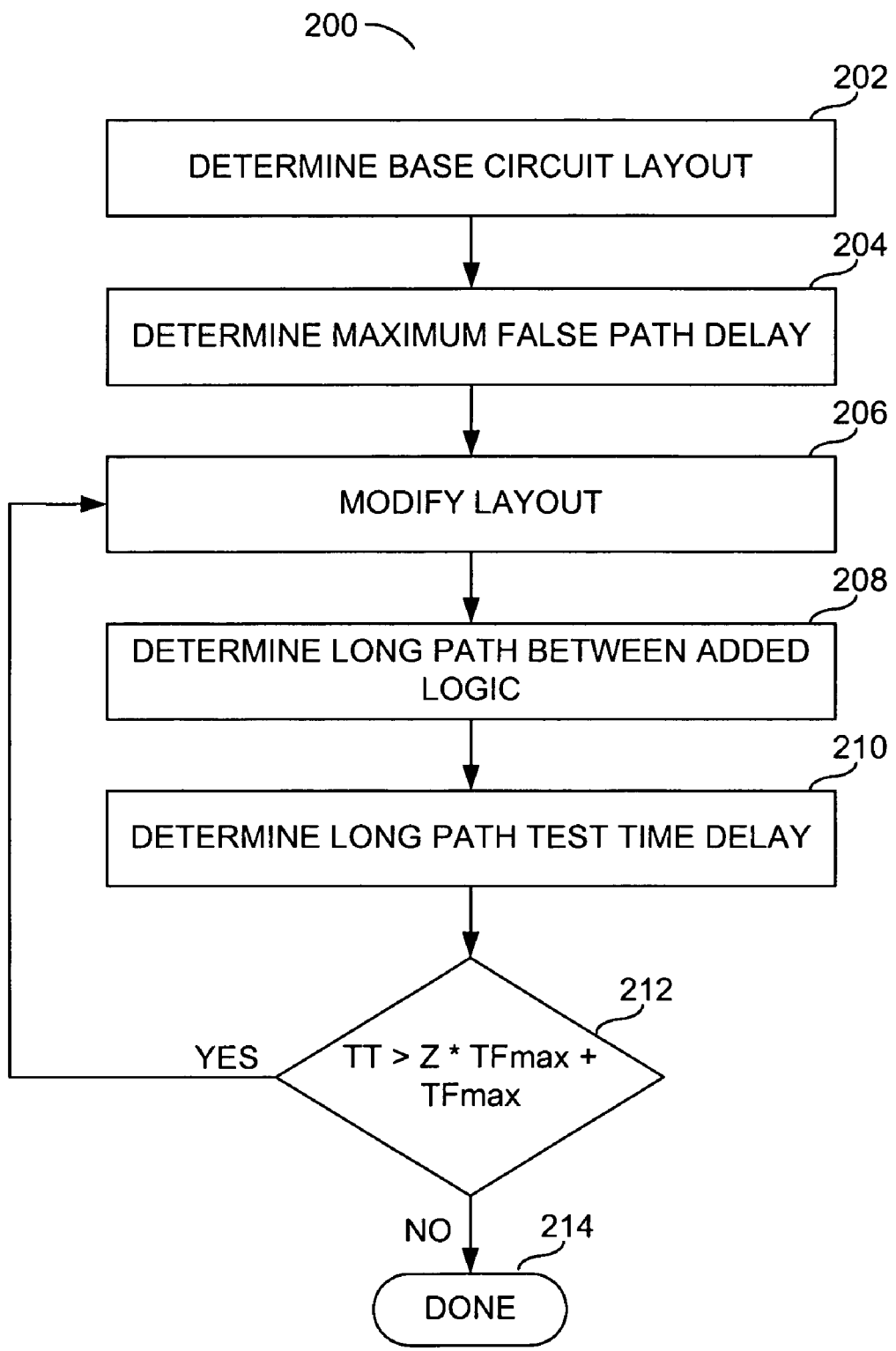
FIG. 3 is a flow diagram of an operation of the present invention.

Referring to FIG. 3, a flow diagram 200 illustrating an operation (or process) of the present invention is shown. The operation 200 may be implemented as a wafer test operation in connection with a tester (not shown). The operation 200 may determine when a particular chip layout containing the circuit 100 is functionally acceptable for a particular application. The process 200 is generally implemented when the false path 116a–116n time delay TF is longer than the time delay TFE of any functionally exercisable path 116a–116n (e.g., when the $TF_{MAX}$ is greater than the delay $TFE_{MAX}$). The process 200 generally comprises a state (or block) 202, a state (or block) 204, a state (or block) 206, a state (or block) 208, a state (or block) 210, a decision state (or block) 212, and a state (or block) 214.

The base circuit layout 102 (e.g., determination of the positions of the circuits 110a–110n and 112a–112n and the logic cones 114a–114n) on a die may be performed (e.g., the block 202). The maximum false path time delay $TF_{MAX}$ may be determined (e.g., measured) using STA (e.g., the block 204). The layout of the circuit 100 may be modified. Logic (e.g., the circuits 110(n+1) and 112(a−1)) may be positioned at the respective locations distal to the base circuit 102 layout (e.g., the block 206). The long path logic cone 114(n+1) and the corresponding long path 116(n+1) may be configured (or added) between the circuits 110(n+1) and 112(a−1) to meet the value of the parameter z for the particular application (e.g., the block 208). The time delay of the test long path 116(n+1) (e.g., the test interval TT) may be determined (e.g., measured) using STA (e.g., the block 210).

The time delay TT may be compared to the maximum false path time delay $TF_{MAX}$ (e.g., the decision block 212). When the time delay TT is greater than the parameter z times the maximum false path time delay $TF_{MAX}$ plus the delay $TF_{MAX}$ (e.g., when $TT>z*TF_{MAX}+TF_{MAX}$), the long path 116(n+1) that was selected may exceed the test parameters for the particular application and functionally acceptable parts may be mis-identified. The long path logic cone 114(n+1) and the corresponding long path 116(n+1) may be reconfigured between the circuits 110(n+1) and 112(a−1) to meet the value of the parameter z for the particular application (e.g., the process 200 may return to the block 206). When the time delay TT is equal to or less than the parameter z times the maximum false path time delay $TF_{MAX}$ plus the delay $TF_{MAX}$ (e.g., when $TT \leq z*TF_{MAX}+TF_{MAX}$), the long path 116(n+1) may be successfully routed via the logic cone 114(n+1) and the process (or method) 200 may be done (e.g., the block 214).

Figure 4:
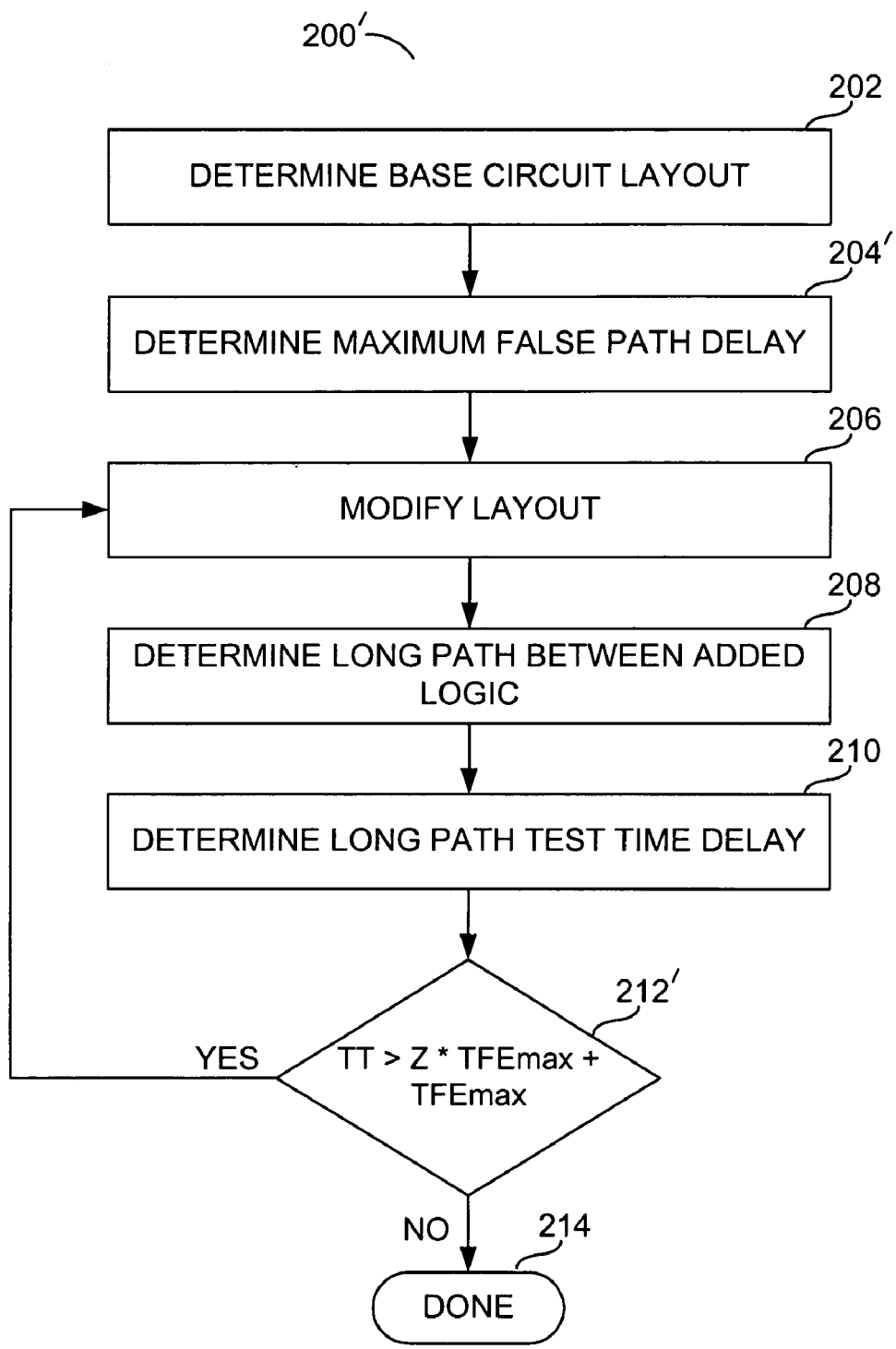
FIG. 4 is a flow diagram of an alternative operation of the present invention.

Referring to FIG. 4, a flow diagram 200' illustrating an alternative operation (or process) of the present invention is shown. The operation (or process) 200' may be implemented similarly to the process 200. The process (or method) 200' is generally implemented when the functionally exercisable paths 116a–116n are difficult to control (e.g., when the interval $TFE_{MAX}$ may be greater than the interval $TF_{MAX}$) and/or if $TF_{MAX}$ is not present, such as with a design with no false paths. The process 200' generally comprises a state (or block) 204' and a decision state (or block) 212'.

The maximum functionally exercisable path time delay $TFE_{MAX}$ may be determined (e.g., measured) using STA (e.g., the block 204'). The time delay TT may be compared to the maximum functionally exercisable path time delay $TFE_{MAX}$ (e.g., the decision block 212'). When the time delay TT is greater than the parameter z times the maximum functionally exercisable path time delay $TFE_{MAX}$ plus the delay $TFE_{MAX}$ (e.g., when $TT>z*TFE_{MAX}+TFE_{MAX}$), the long test path 116(n+1) that was selected may exceed the test parameters for the particular application and functionally acceptable parts may be mis-identified.

The present invention may (i) implement a long test path that is fully controllable, observable, and/or predictable and (ii) have an incrementally longer propagation test delay than the longest false path delay or the longest functional path delay (when the functional path is difficult to control and/or observe and/or false paths are not present). The present invention generally reduces chip development cost and time while identifying functionally defective chips and/or reducing mis-identification of functionally acceptable chips.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a plurality of first base circuits coupled to a plurality of second base circuits via a plurality of base circuit paths on a layout, wherein (i) each of said plurality of base circuit paths has a time delay, (ii) each of said plurality of first base circuits are positioned throughout the layout, and (iii) said plurality of second base circuits are positioned throughout the layout;
   a first test circuit disposed in a first distal location outside of said layout;
   a second test circuit disposed in a second distal location outside of said layout; and
   a test path configured to (i) couple said first test circuit to said second test circuit and (ii) generate a test time delay from said first test circuit to said second test circuit incrementally longer than any of said time delays generated by any of said base circuit paths.

2. The apparatus according to claim 1, wherein said time delay generated by said base circuit path comprises a maximum functionally exercisable path delay.

3. The apparatus according to claim 2, wherein said time delay generated by said base circuit path comprises a difficult to control maximum functionally exercisable path delay.

4. The apparatus according to claim 1, wherein said time delay generated by said base circuit path comprises a maximum false path delay.

5. The apparatus according to claim 1, wherein said second distal location is configured on a side of said layout opposite said first distal location.

6. The apparatus according to claim 1, wherein said first base circuits coupled to said second base circuits form source-destination pairs.

7. The apparatus according to claim 1, wherein said first base, second base, first test, and second test circuits comprise flip-flop circuits.

8. The apparatus according to claim 1, wherein said base circuit paths comprise one or more logic cones.

9. The apparatus according to claim 8, wherein said test path comprises a logic cone configured as built-in logic within said one or more logic cones.

10. The apparatus according to claim 8, wherein said test path comprises a logic cone (i) external to said one or more logic cones and (ii) disposed at one or more peripheries of said layout.

11. The apparatus according to claim 1, wherein said first and second test circuits are fully (i) controllable and (ii) observable during an at-speed testing process.

12. The apparatus according to claim 1, wherein said test time delay comprises an interval nominally 0.05 times longer than said time delay generated by any of said base circuit paths.

13. The apparatus according to claim 1, wherein said test time delay comprises an interval in a range of 0.001 to 0.5 times longer than said time delay generated by any of said base circuit paths.

14. The apparatus according to claim 1, wherein (i) said first test circuit is disposed at a first periphery of said layout and (ii) said second test circuit is disposed at a second periphery of said layout.

15. The apparatus according to claim 1, wherein (i) said first base, second base, first test, and second test circuits, (ii) said base circuit paths, and (iii) said test path are clocked by a common clock.

16. An apparatus configured to generate an at-speed test path delay comprising:

means for coupling a plurality of first base circuits to a plurality of second base circuits via a plurality of base circuit paths on a layout, wherein (i) each of said plurality of base circuit paths has a time delay, (ii) each of said plurality of first base circuits are positioned throughout the layout, and (iii) each of said plurality of second base circuits are positioned throughout the layout;

means for disposing (i) a first test circuit in a first distal location outside of said layout and (ii) second test circuit in a second distal location outside of said layout; and means for coupling said first test circuit to said second test circuit to generate said test path delay from said first test circuit to said second test circuit incrementally longer than any of said time delays generated by any of said base circuit paths.

17. A method of generating an at-speed test path delay comprising the steps of:

(A) coupling a plurality of first base circuits to a plurality of second base circuits via a plurality of base circuit paths on a layout, wherein (i) each of said plurality of base circuit paths has a time delay, (ii) each of said plurality of first base circuits are positioned throughout the layout, and (iii) each of said plurality of second base circuits are positioned throughout the layout;

(B) disposing (i) a first test circuit in a first distal location outside of said layout and (ii) a second test circuit in a second distal location outside of said layout; and (C) coupling said first test circuit to said second test circuit via a test circuit path, wherein said test circuit path is configured to have a test path delay less than an incremental delay plus said base circuit path delay.

18. The method according to claim 17, wherein said base circuit path delay comprises a functionally exercisable path delay.

19. The method according to claim 17, wherein said base circuit path delay comprises a false path delay.

20. The method according to claim 17, wherein step (C) further comprises repeating step (B) when said test path delay is greater than said incremental delay plus said base circuit path delay.

* * * * *